US012648471B1

(12) United States Patent
Nanjesh et al.

(10) Patent No.: US 12,648,471 B1
(45) Date of Patent: Jun. 2, 2026

(54) SUBSTRATE CARRIER

(71) Applicant: Yield Engineering Systems, Inc.,
Fremont, CA (US)

(72) Inventors: Umashankara M. Nanjesh, Bangalore
(IN); Jerin P. John, Bangalore (IN);
Arvind Patil, Bangalore (IN); **Krishna
Channaiah, Bangalore (IN); Sossan
Wali, Valencia (ES); Hratch
Mouradian**, Valencia (ES)

(73) Assignee: Yield Engineering Systems, Inc.,
Fremont, CA (US)

( * ) Notice: Subject to any disclaimer, the term of this
patent is extended or adjusted under 35
U.S.C. 154(b) by 0 days.

(21) Appl. No.: 19/358,005

(22) Filed: Oct. 14, 2025

(51) Int. Cl.
| | |
|---|---|
| *H01L 23/13* | (2006.01) |
| *H01L 21/673* | (2006.01) |
| *H01L 21/687* | (2006.01) |
| *H01L 23/14* | (2006.01) |

(52) U.S. Cl.
CPC ........ *H01L 23/13* (2013.01); *H01L 21/67309*
(2013.01); *H01L 21/687* (2013.01); *H01L
23/14* (2013.01)

(58) Field of Classification Search
CPC ......... H01L 23/01; H01L 23/13; H01L 21/00;
H01L 21/67; H01L 21/67303; H01L
21/67309; H01L 21/6732; H01L
21/67326; H01L 21/683; H01L 21/687;
H01L 21/6838
See application file for complete search history.

(56) References Cited

U.S. PATENT DOCUMENTS

| | | | | |
|---|---|---|---|---|
| 5,603,777 | A | * | 2/1997 | Ohashi .............. H01L 21/67712 |
| | | | | 414/940 |
| 8,397,917 | B2 | * | 3/2013 | Kasama ............ H01L 21/67383 |
| | | | | 211/41.18 |
| 8,601,651 | B2 | | 12/2013 | Christen |
| 2017/0323815 | A1 | | 11/2017 | Kuenanz et al. |
| 2019/0376177 | A1 | | 12/2019 | Butler et al. |

FOREIGN PATENT DOCUMENTS

TW          M602806  U      10/2020

OTHER PUBLICATIONS

International Search Report and Written Opinion in International
Application No. PCT/US2025/049812, mailed on Dec. 4, 2025, 10
pages.

* cited by examiner

*Primary Examiner* — Dale E Page
*Assistant Examiner* — Quovaunda Jefferson
(74) *Attorney, Agent, or Firm* — Fish & Richardson P.C.

(57)          ABSTRACT
A substrate carrier including an enclosure to hold substrates.
The enclosure includes walls configured to surround the
substrates, where the walls include a front panel, a back
panel parallel to the front panel, and two side panels
perpendicular to the front and back panels and to the
substrates. The enclosure further includes a top opening, and
a bottom opening. The substrate carrier further includes an
adjustable clamping mechanism on each of the two side
panels. The adjustable clamping mechanism includes a
plurality of pairs of jaws that are each configured to clamp
one of the substrates, where the jaws in each pair face one
another with an intervening gap that is configured to accom-
modate a substrate. The substrate carrier further includes a
locking mechanism on at least one of the two side panels,
configured to lock positions of the plurality of pairs of jaws
to fix positions of the substrates.

20 Claims, 7 Drawing Sheets

SUBSTRATE CARRIER

TECHNICAL FIELD

The present disclosure generally relates to a substrate carrier.

BACKGROUND

In semiconductor processing, a substrate carrier is used to securely hold one or more semiconductor substrates for safe transport between or within equipment through various stages of device fabrication.

SUMMARY

Implementations of the present disclosure are directed to a substrate carrier (also referred to simply as a carrier) to securely hold various types of substrates, e.g., glass panel substrates, copper clad laminate (CCL) panel substrates, or aluminum silicate substrates, with clamping and locking mechanisms. For example, the substrate carrier can be configured to hold up to twelve glass panel substrates (each also referred to simply as a panel) and securely hold them during a process involving shock and agitation. The clamping mechanisms of the substrate carrier can be designed to provide a precisely controlled clamping force to prevent substrate slippage while avoiding substrate breakage from excessive compression. Having pairs of fixed jaws and movable jaws, the substrate carrier can adjust the clamping force based on substrate thickness, e.g., 0.2 mm to 3.4 mm, and the number of substrates loaded in the carrier. The substrate carrier can be used for various batch processing tasks such as etching, deposition/plating, cleaning, and drying stations. The carrier can be integrated in an automated processing tool while ensuring precise alignment, stability, and uniform exposure throughout various process steps. This carrier system can improve the throughput, and enhance the process efficiency by maintaining laminar flow with confined space.

An implementation described in this disclosure provides a substrate carrier. The substrate carrier includes an enclosure to hold a plurality of substrates. The enclosure includes walls configured to surround the plurality of substrates, where the walls include a front panel, a back panel parallel to the front panel, and two side panels perpendicular to the front and back panels and to the plurality of substrates. The enclosure further includes a top opening, and a bottom opening. The substrate carrier further includes an adjustable clamping mechanism on each of the two side panels. The adjustable clamping mechanism includes a plurality of pairs of jaws that are each configured to clamp a substrate of the plurality of substrates, where the jaws in each pair face one another with an intervening gap that is configured to accommodate a substrate. The substrate carrier further includes a locking mechanism on at least one of the two side panels, where the locking mechanism is configured to lock positions of the plurality of pairs of jaws to fix positions of the plurality of substrates.

In an aspect, each pair of jaws includes a fixed jaw and a movable jaw, and the intervening gap is adjustable by moving the movable jaw.

In an aspect, combinable with any other aspect, each pair of jaws includes a fixed jaw and a movable jaw, and the adjustable clamping mechanism further includes a movable support attached to the plurality of pairs of jaws and configured to be maneuvered to control positions of the plurality of movable jaws.

In an aspect, the substrate carrier further includes a moving mechanism to maneuver the movable support.

In an aspect, the substrate carrier further includes a controller coupled to the moving mechanism, where the controller is configured to control the moving mechanism to maneuver the movable support.

In an aspect, the locking mechanism is configured to lock the positions of the plurality of movable jaws by locking a position of the movable support.

In an aspect, combinable with any other aspect, each pair of jaws of the adjustable clamping mechanism includes a plurality of elastomeric buttons that are disposed on each jaw of the pair of jaws. The plurality of elastomeric buttons are configured to be in contact with a substrate to clamp the substrate between the pair of jaws.

In an aspect, combinable with any other aspect, the plurality of elastomeric buttons include a perfluoroelastomer (FFKM).

In an aspect, combinable with any other aspect, the adjustable clamping mechanism further includes a sensor to monitor a clamping force applied by the plurality of the movable jaws to the plurality of substrates.

In an aspect, combinable with any other aspect, the substrate carrier further includes a plurality of handles attached to the enclosure. The plurality of handles are configured to be coupled to an agitation mechanism to agitate the substrate carrier.

In an aspect, combinable with any other aspect, the substrate carrier further includes a plurality of bottom mandrels bridging the front and back panels at bottom portions of the front and back panels.

In an aspect, the substrate carrier further includes a plurality of top removable mandrels bridging the front and back panels at top portions of the front and back panels. At least one of the bottom mandrels or the top removable mandrels are configured to maintain uniform spacing among the substrates clamped in the enclosure.

In an aspect, combinable with any other aspect, the enclosure is made of stainless steel.

In an aspect, combinable with any other aspect, the plurality of fixed jaws and the plurality of movable jaws are made of polyetheretherketone (PEEK) or polytetrafluoroethylene (PTFE).

Another implementation described in this disclosure provides a substrate carrier including a stainless-steel enclosure to hold more than one substrate aligned vertically. The stainless-steel enclosure includes walls configured to surround the substrates, where the walls include a front panel, a back panel parallel to the front panel, and two side panels perpendicular to the front and back panels and to the substrates. The stainless-steel enclosure further includes a top opening, and a bottom opening. The substrate carrier further includes an adjustable clamping mechanism on each of the two side panels. The adjustable clamping mechanism includes a plurality of pairs of jaws that are each configured to clamp one of the substrates. The jaws in each pair face one another with an intervening gap that is configured to accommodate the one of the substrates. Each pair of jaws includes a fixed jaw and a movable jaw. The intervening gap is adjustable by moving the movable jaw. The adjustable clamping mechanism further includes a movable support attached to the movable jaws, a moving mechanism attached to the movable support, and a controller coupled to the moving mechanism. The controller is configured to control positions of the movable jaws by moving the movable support. The substrate carrier further includes a locking mechanism on each of the two side panels, configured to lock positions of the movable jaws to fix positions of the substrates within the stainless-steel enclosure.

In an aspect, the controller is further configured to, based on a thickness of the one of the substrates, determine a target clamping force to apply to the one of the substrates. The controller is further configured to, using a sensor attached to the adjustable clamping mechanism, monitor a clamping force applied to the one of the substrates. The controller is further configured to, based on the monitored clamping force, make an adjustment to achieve the target clamping force.

In an aspect, combinable with any other aspect, the substrate carrier further includes a plurality of bottom mandrels bridging the front and back panels at bottom portions of the front and back panels. The substrate carrier further includes a plurality of top removable mandrels bridging the front and back panels at top portions of the front and back panels.

Another implementation described in this disclosure provides a system for wet processing a plurality of substrate. The system includes a vessel filled with a treatment fluid, configured to receive a substrate carrier holding a plurality of substrates. The system further includes a temperature controller to maintain a temperature of the treatment fluid in the vessel. The system further includes an agitation mechanism to provide an agitation to the substrate carrier during a wet processing of the plurality of substrates. The system further includes the substrate carrier. The substrate carrier includes an enclosure to hold the plurality of substrates. The enclosure includes walls configured to surround the plurality of substrates, a top opening, and a bottom opening. The walls include a front panel, a back panel parallel to the front panel, and two side panels perpendicular to the front and back panels and to the plurality of substrates. The substrate carrier further includes an adjustable clamping mechanism on each of the two side panels. The adjustable clamping mechanism includes a plurality of pairs of jaws that are each configured to clamp a substrate of the plurality of substrates. The jaws in each pair face one another with an intervening gap that is configured to accommodate a substrate.

In an aspect, each pair of jaws includes a fixed jaw and a movable jaw, and the intervening gap is adjustable by moving the movable jaw.

In an aspect, the substrate carrier further includes a locking mechanism on each of the two side panels, configured to lock positions of the movable jaws to fix positions of the plurality of substrates.

The details of one or more implementations of the subject matter of this disclosure are set forth in the accompanying drawings and the description below. Other features, aspects, and advantages of the subject matter will become apparent from the description, the drawings, and the claims.

DETAILED DESCRIPTION

Various aspects of this disclosure describe a substrate carrier. Generally, semiconductor devices are fabricated on substrates, and in various stages of fabrication, the substrates are held by one or more substrate carriers during the processing. Conventional carriers for glass substrates often lack adaptability in clamping force, making them unsuitable for handling a wide range of substrate thicknesses. Further, the number of glass substrates that many of such carriers can hold may be limited only up to seven. They may also lack features for tracking the carrier in the process tools, and the panels may need to be manually loaded and unloaded for each cycle of the process. Additionally, traditional carriers may not effectively withstand shock and agitation processes, leading to substrate slippage or breakage. Some carriers rely on fixed clamping mechanisms but they can either over-compress delicate panels, resulting in damaging them, or fail to secure them adequately. They may also require frequent servicing of clamping pads, which can degrade faster since the pads are non-semiconductor grade, affecting the process throughput. The existing carrier setup may also suffer turbulent flow between the panels, along with uneven fluid velocity distribution, impacting the process performance.

The substrate carrier described in this disclosure can addresses these limitations by introducing an adaptable clamping mechanism. The adaptable clamping mechanism can have pairs of fixed jaws and movable jaws, where each pair of jaws can clamp the substrate with an appropriate clamping force, which is based on the thickness, panel material, and number of the panels, while preventing damage. The clamping force can be adjusted to securely hold the substrates during processes with shock and agitation, such as etching, deposition/plating, cleaning, and drying stations. In various implementations, the substrate carrier can hold up to twelve substrates while ensuring their positions and an ideal lamellar flow of a fluid between the substrates. The substrate carrier can be integrated into an automated processing system, and steps of loading, locking the positions, unlocking, and unloading, among others can be automated and performed by a robotic system.

In the following sections, the substrate carrier of this disclosure is described referring to FIGS. 1-4. A flow pattern achievable in the substrate carrier is described referring to FIG. 5. A process equipment that includes a substrate carrier and is configured to perform a dynamic process with agitation is then described referring to FIG. 6.

Figure 1:
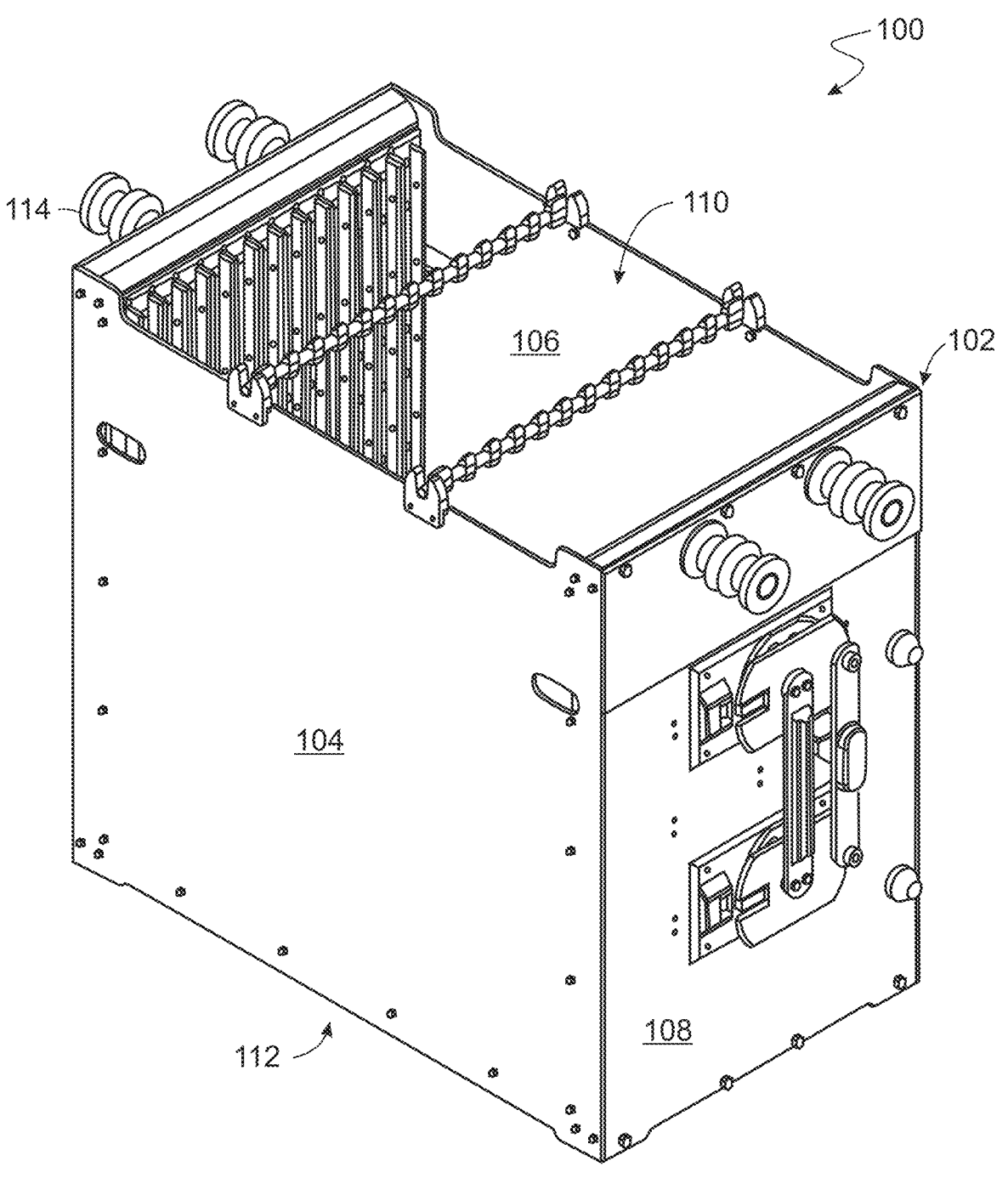
FIG. 1 shows a perspective view of a substrate carrier, according to one or more implementations.

FIG. 1 illustrates a substrate carrier 100, according to one or more implementations of this disclosure. The substrate carrier 100 can include an enclosure 102 having walls configured to surround more than one substrate. As illustrated in FIG. 1, the walls can include a front panel 104, a back panel 106 parallel to the front panel 104, and two side panels 108 perpendicular to the front and back panels 104, 106 and to the substrates (not shown in FIG. 1). In various implementations, the enclosure 102 is not completely sealed or closed, and having a top opening 110 and a bottom opening 112 to allow a fluid to be flowed for substrate treatment, e.g., etching, deposition, or cleaning.

In various implementations, some or all of the components of the enclosure 102 are made of materials chemically and thermally stable during the intended fabrication/cleaning processes. For example, the enclosure 102 can be made of metals such as stainless steel or titanium. The surface of the enclosure can be polymer coated to provide resistance to various chemicals and thermal variations that can be used in various substrate treatment processes. In some implementations, the polymer coating can include ethylene chlorotrifluoroethylene (ECTFE), e.g., HALAR® coating. The polymer coating can ensure chemical resistance and durability at a wide range of temperatures, e.g., from about 0° C. to about 150° C.

In various implementations, the substrates to be held in the substrate carrier 100 can include glass substrates, CCL panels, or aluminum silicate substrates. Glass substrates can be used in semiconductor manufacturing as carriers and interposers, and CCL panels can be used for manufacturing printed circuit boards (PCBs) upon which electronic components are mounted and interconnected. Aluminum silicate substrates can be used in insulation applications. In various implementations, a substrate has a thickness from about 0.2 mm to about 3.4 mm. In various implementations, a substrate has a side length from about 100 mm to about 600 mm. For example, the side of the substrate can be from about 100 mm to about 400 mm, from about 100 mm to about 200 mm, from about 300 mm to about 600 mm, or from about 500 mm to about 600 mm. In some implementations, the substrate can have dimensions from about 310 mm×about 310 mm to about 600 mm×about 600 mm. In some implementations, the substrate can have dimensions of about 510 mm×about 515 mm.

The enclosure 102 can be sized accordingly and configured to hold various types of substrates as described above. In some implementations, the enclosure 102 has an outer dimensions of about 750.7 mm (L)×about 583.0 mm (H)× about 371.0 mm (W).

In some implementations, the substrate carrier 100 includes one or more handles 114 attached to the enclosure 102. The handles 114 can be used to couple the substrate carrier 100 to a processing system that will be described below referring to FIG. 6.

Figure 2A:
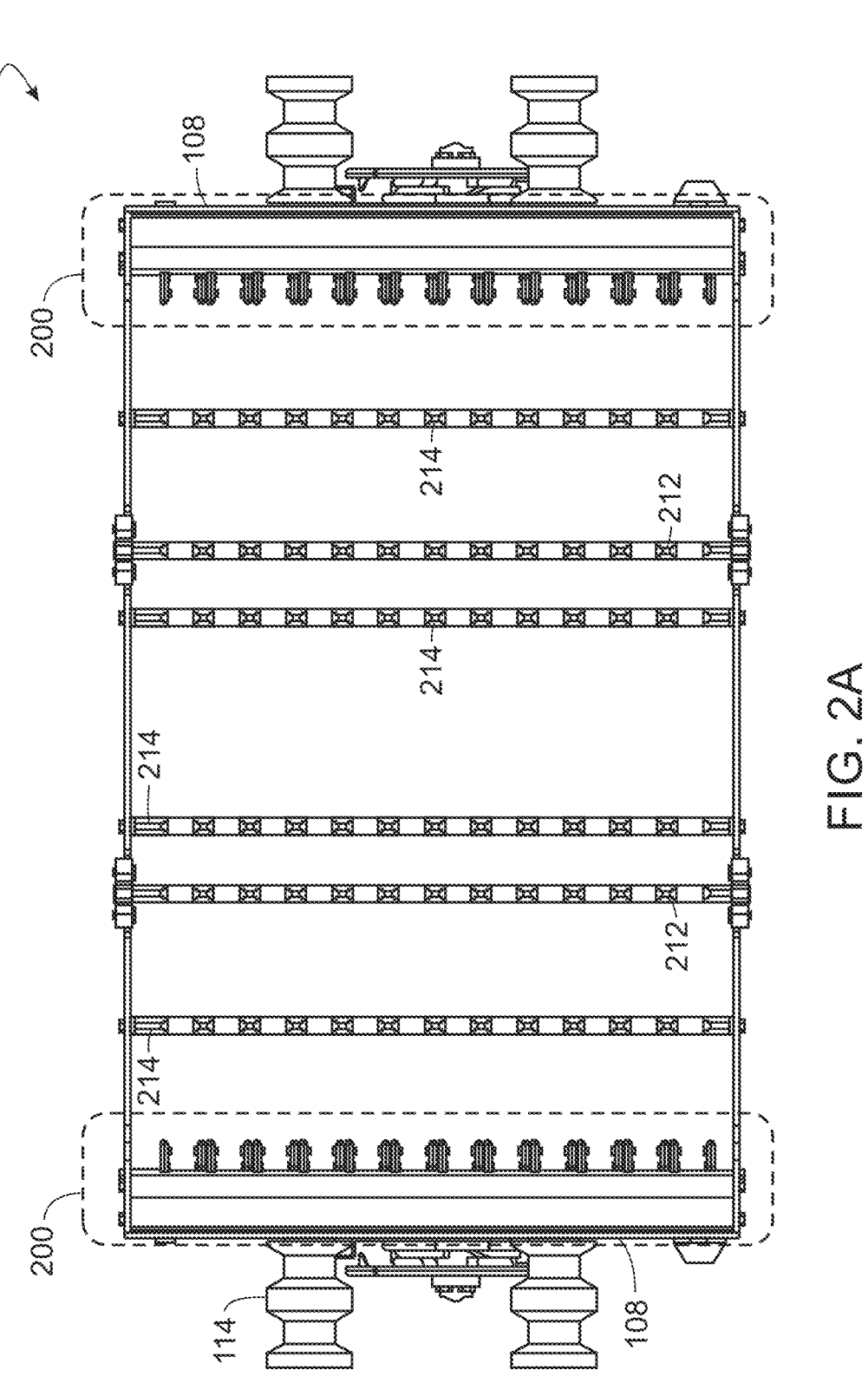
FIG. 2A shows a top view of a substrate carrier, according to one or more implementations.
Figure 2B:
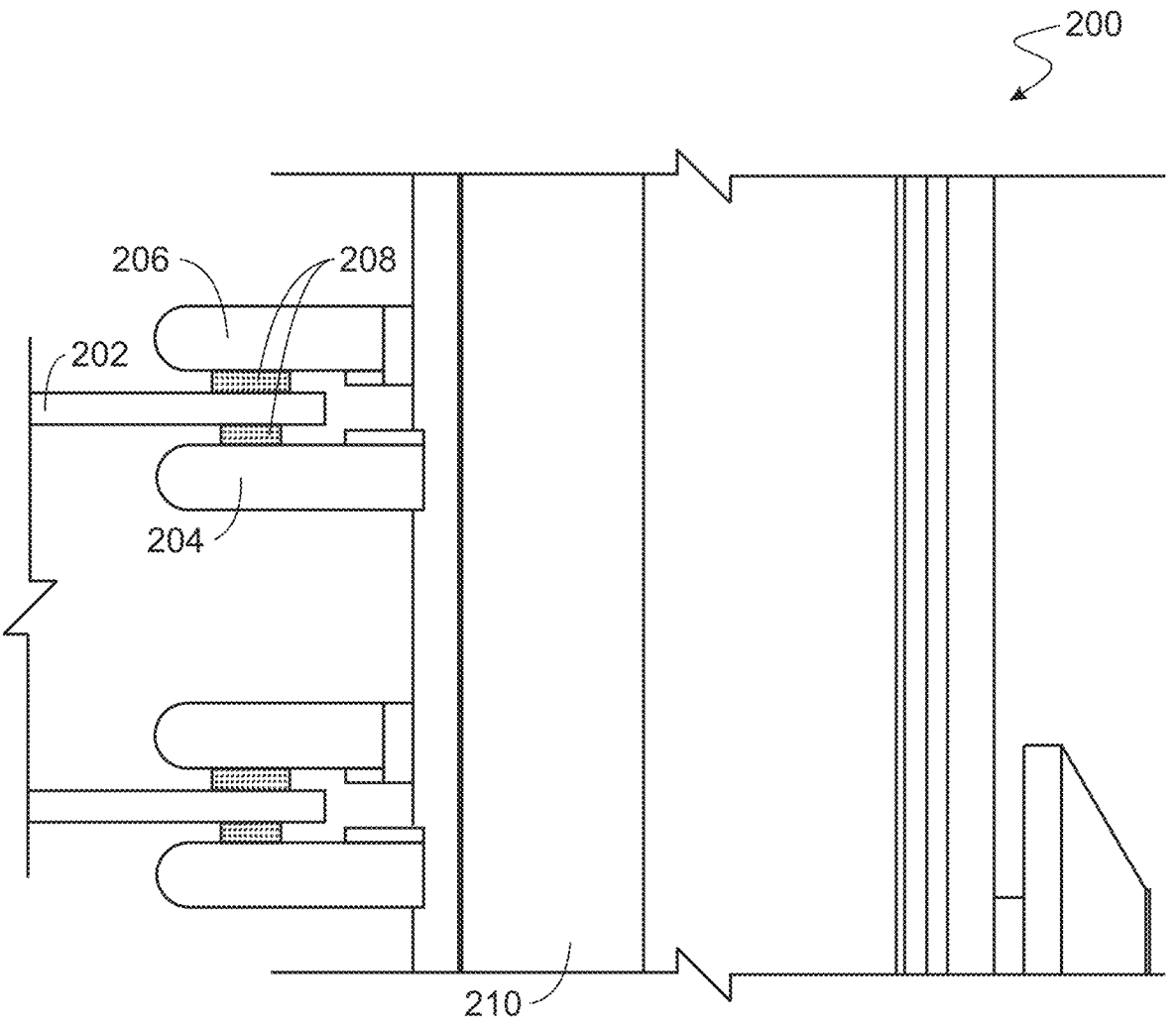
FIG. 2B shows an enlarged section of FIG. 2A for a clamping mechanism, according to one or more implementations.
Figure 3:
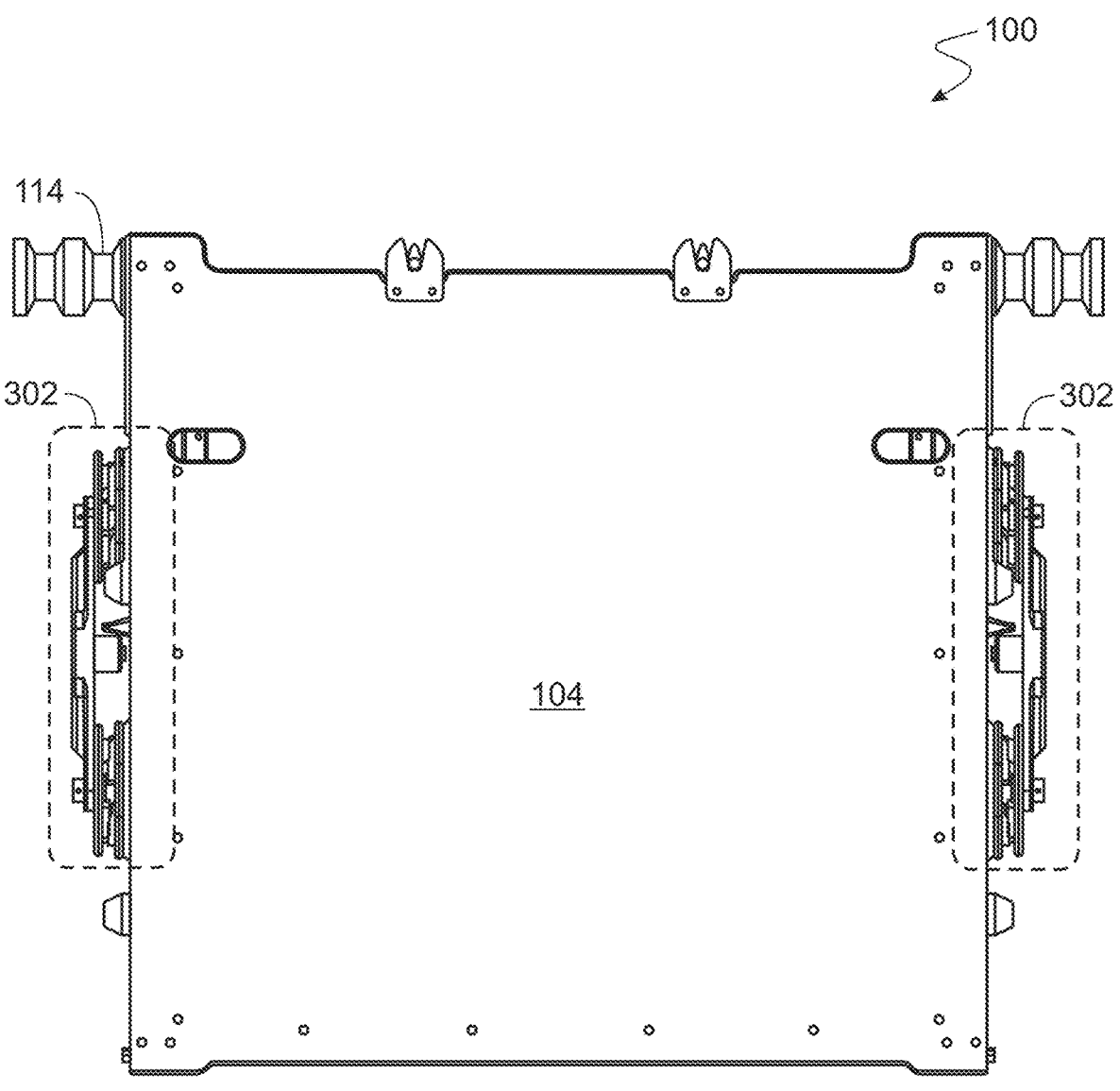
FIG. 3 shows a front view of a substrate carrier, according to one or more implementations.
Figure 4:
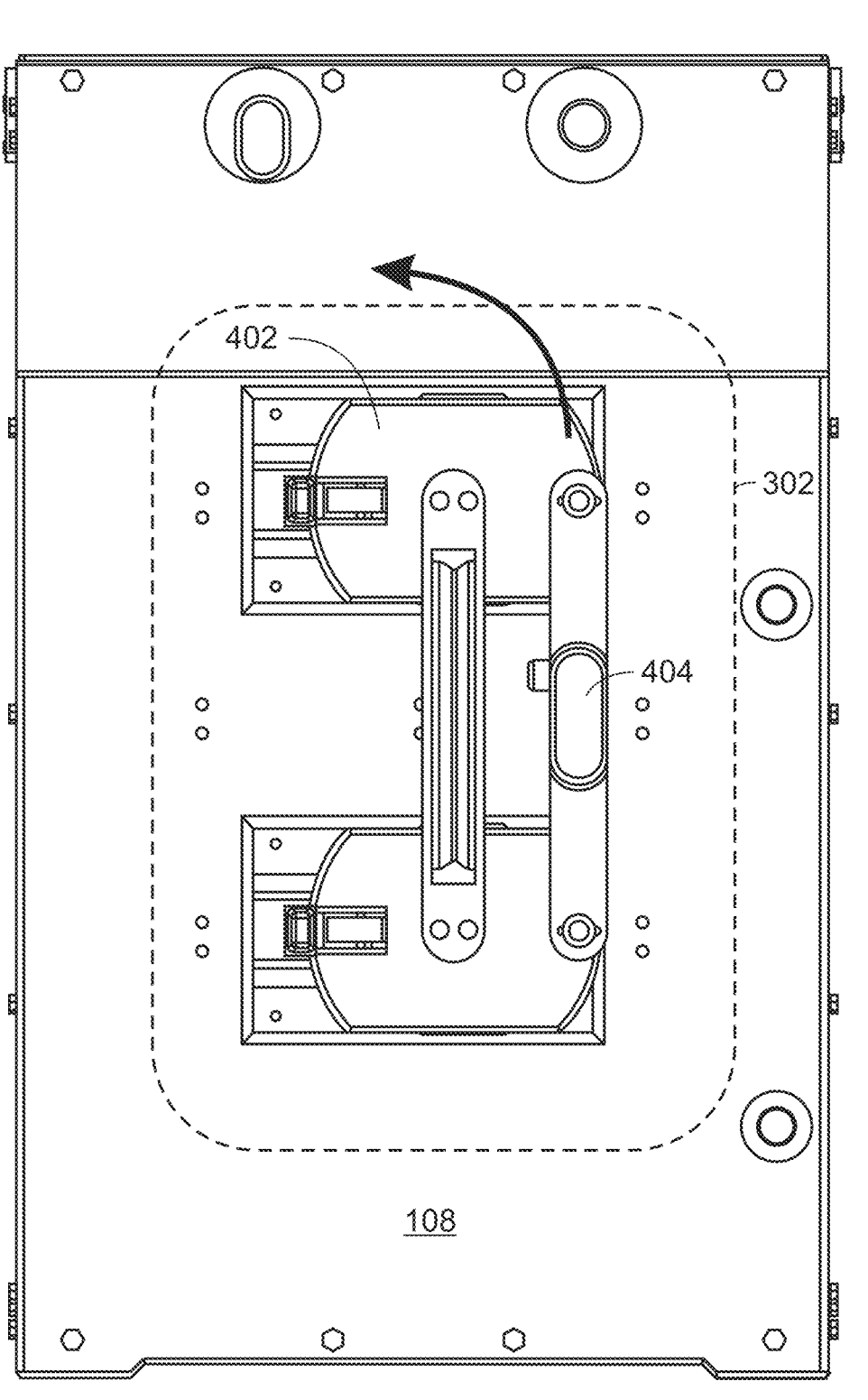
FIG. 4 shows a side view of a substrate carrier, according to one or more implementations.

FIGS. 2A-2B show a top views of the substrate carrier 100 and an adjustable clamping mechanism 200 of the substrate carrier 100, according to one or more implementations of this disclosure. FIGS. 3-4 show front and side views of the substrate carrier 100, respectively, according to one or more implementations. In various implementations, as illustrated in FIG. 2A, the adjustable clamping mechanism 200 is on each of the two side panels 108. The adjustable clamping mechanism has pairs of jaws that are each configured to clamp a substrate 202. For example, as illustrated in FIG. 2B, each pair of jaws can include a fixed jaw 204 and a movable jaw 206, where the jaws in each pair face one another with an intervening gap that is configured to accommodate the substrate 202. By moving the movable jaw 206 relative to the position of the fixed jaw 204, the intervening gap can be adjusted. The substrate 202 can be inserted when the intervening gap is sufficiently wide (loading position), and once the substrate 202 is loaded, the moving jaw 206 can be moved to tighten the intervening gap and apply an appropriate clamping force to the substrate 202 to securely hold it.

The fixed jaws 204 and the movable jaws 206 can be made of high-performance thermoplastic polymer. For example, they can be made of polyether ether ketone (PEEK) or polytetrafluoroethylene (PTFE).

In various implementations, the substrate 202 is held at an exclusion area. Here, the exclusion area refers to the 10 mm area from the glass substrates edge all around, which can be designated for handling a glass substrate. For example, the exclusion area of the glass substrate can be a dead zone without any device, while the remaining portion is productive.

In various implementations, as illustrated in FIG. 2B, each pair of jaws of the adjustable clamping mechanism 200 further includes pairs of elastomeric buttons 208. The elastomeric buttons 208 can help provide desired friction coefficient and a cushioning effect to prevent damaging the substrate 202 during transfer or process with shock and agitation. Each button can be disposed on each jaw of the pair of jaws between the substrate 202 and the jaw (fixed or movable). The elastomeric buttons 208 can be configured to be in contact with the substrate 202 to clamp it between the pair of jaws. The elastomeric buttons 208 are made of perfluoroelastomer (FFKM). Examples of FFKM include but are not limited to Kalrez®, Chemraz®, Markez®, and Eztra®, Perlast®, and Kyflon®. In some implementations, other materials such as fluorocarbon rubber (FKM) or silicon-based materials can also be used for the elastomeric buttons 208. In various implementations, the elastomeric buttons 208 are O-ring pads. In some implementations, the elastomeric buttons 208 are Kalrez® O-ring pads.

In various implementations, the maximum clamping force applied is between about 60 newton (N) and 70 N, e.g., from about 66.8 N to about 68.7 N (corresponding to exerting a weight of about 6.8-7.0 kg). In some implementations, the clamping force is sufficient to hold a substate experiencing 12 G equivalent vibrations caused by the shock and agitation mechanism.

In some implementations, the clamping force can be selected to securely hold the substrate 202, e.g., a glass substrate, but avoid any flexural cracking. Although not specifically illustrated, in various implementations, the clamping mechanism of the substrate carrier 100 can further include one or more sensors to monitor the clamping force applied to the substrate 202.

Referring back to FIG. 2A, the number of pairs of jaws of the adjustable clamping mechanism 200 can correspond to the maximum number of substrates 202 that the substrate carrier 100 can hold at once. For example, in FIG. 2A, twelve pairs are illustrated to show an example of the substrate carrier 100 configured to hold up to twelve substrates. While conventional carrier designs are often limited to only up to seven substrates, various implementations of the substrate carrier 100 can have the improved capacity thanks to the efficient use of space with the adjustable clamping mechanism 200.

In various implementations, the adjustable clamping mechanism 200 is configured to move some or all of the movable jaws 206 from different pairs simultaneously. This feature of unified control of movable jaws 206 is particularly useful in handling multiple substrates together and also applying a uniform clamping force for each substrate. To enable this feature, in some implementations, the adjustable clamping mechanism 200 can further include a movable support 210 (FIG. 2B) attached to some or all of the movable jaws 206. The movable support 210 can be a bar positioned parallel to the side panel 108 and configured to be maneuvered by a moving mechanism to control positions of the connected movable jaws 206 together.

In some implementations, the adjustable clamping mechanism 200 is at least in part automated with sensors and a controller, where real-time monitoring of clamping force can be used to adjust the manipulation of the movable jaws 206 through, for example, the movable support 210, and accordingly the applied force. Accordingly, the controller of the substrate carrier 100 can be coupled to the moving mechanism and configured to control the moving mechanism to maneuver the movable support 210.

In some implementations, the substrate carrier 100 further includes top mandrels 212, bottom mandrels 214, or both. Mandrels can bridge the front and back panels and function as a guide or guard rail to prevent flexing of the substrates 202, eliminating substrate-to-substrate contact that could compromise the process efficiency or uniformity. Further, these mandrels can be configured to maintain uniform spacing among the substrates 202 clamped in the enclosure 102. In some implementations, the top mandrels 212, the bottom mandrels 214, or both are removable to allow space for access and loading/unloading the substrates 202. The number and locations of these mandrels are not limited to those illustrated in FIG. 2A, and any number of mandrels can be used. In some implementations, two top mandrels 212 and four bottom mandrels 214 are used. The mandrels can be positioned below or above the substrates 202 and in some implementations, they are not in direct contact with the substrates 202, where the substrates 202 are supported by only the adjustable clamping mechanism 200.

Referring to FIGS. 3-4, the substrate carrier 100 can further include a locking mechanism 302 on at least one of the two side panels 108 to secure the position of the movable jaws 206. The locking mechanism 302 can be configured to lock/unlock the position of the movable jaws 206 through the movable support 210. For example, in some implementations as illustrated in FIG. 4, one or more rotating panels 402 are mounted on the side panels 108. The rotating panels 402 can be rotated using a lever 404 between lock and unlock positions with a lever locking mechanism.

In various implementations, the components of the substrate carrier 100 are designed with smooth surfaces to minimize chemical carryover and reduce drying time. Accordingly, in some implementations, perforations in panels are avoided or minimized.

In some implementations, as shown in FIG. 3, the substrate carrier 100 includes small holes on the front panel 104 for installing a through-beam displacement sensor (not shown). The sensor can act as a redundant option to guide the clamping motor by detecting the moving jaw positions. This sensor can be mounted externally on the carrier driving system.

Generally, in wet processes involving a fluid flow over the surface of substrates, having laminar flow and consistent velocity between the substrates can play an important role in ensuring the process uniformity. The substrate carrier of this disclosure can provide a uniform flow velocity for many substrates, e.g., up to twelve substrates, even under shock/agitation conditions.

Figure 5:
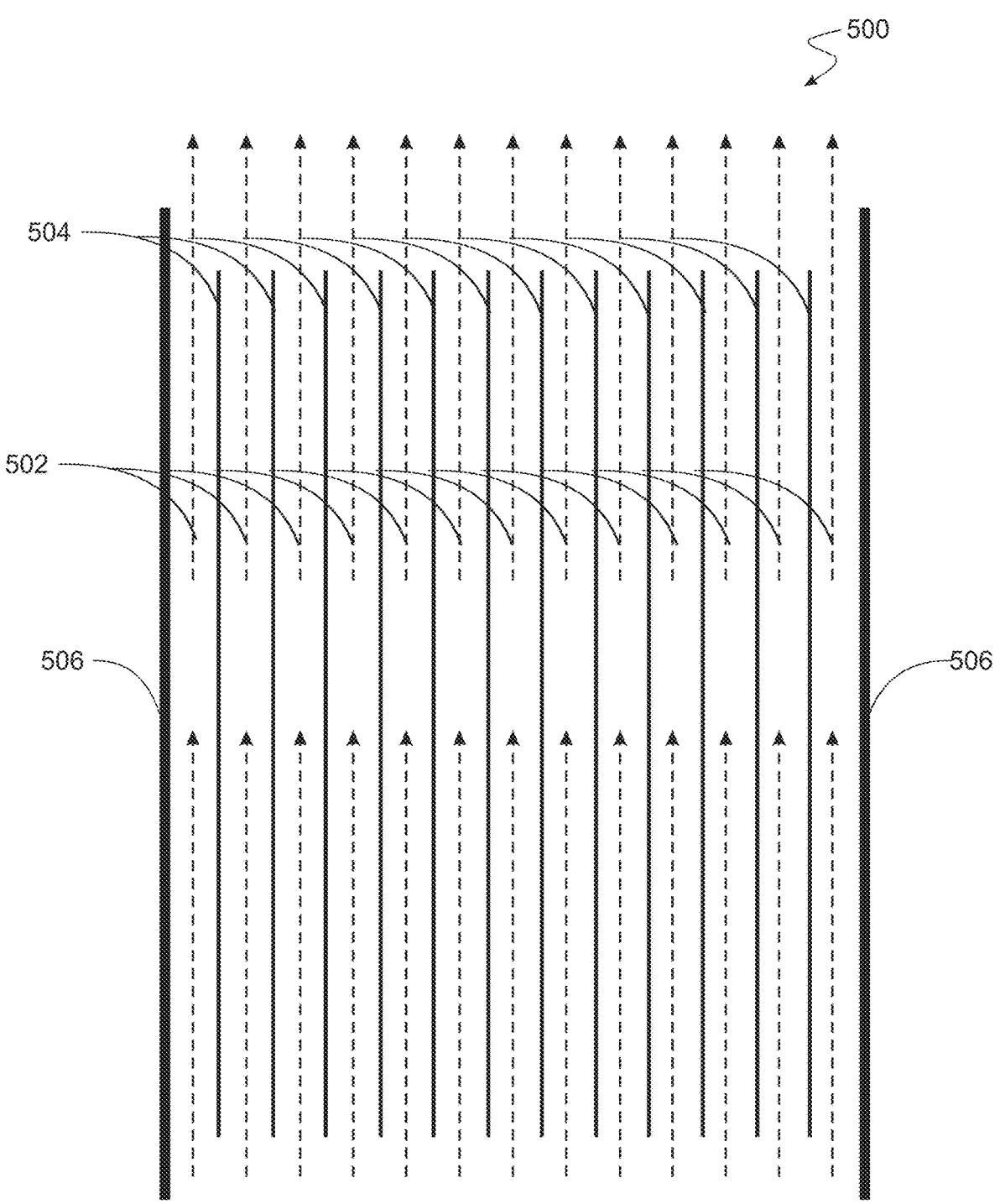
FIG. 5 shows a schematic view of a lamellar flow achievable between multiple substrates in a substrate carrier, according to one or more implementations.

FIG. 5 shows a schematic side view of a lamellar flow 502 achievable between multiple substrates in a substrate carrier 500, according to one or more implementations of this disclosure. As illustrated in FIG. 5, in some implementations, twelve substrates 504 are evenly distributed in the substrate carrier 500. Side panels 506 can ensure the flow uniformity for the first and last substrates. In some implementations, the substrate-to-substrate pitch is from about 20 mm to about 30 mm, e.g., about 27 mm. Further, the substrate carrier can maintain the substrate warpage below about 6 mm.

Figure 6:
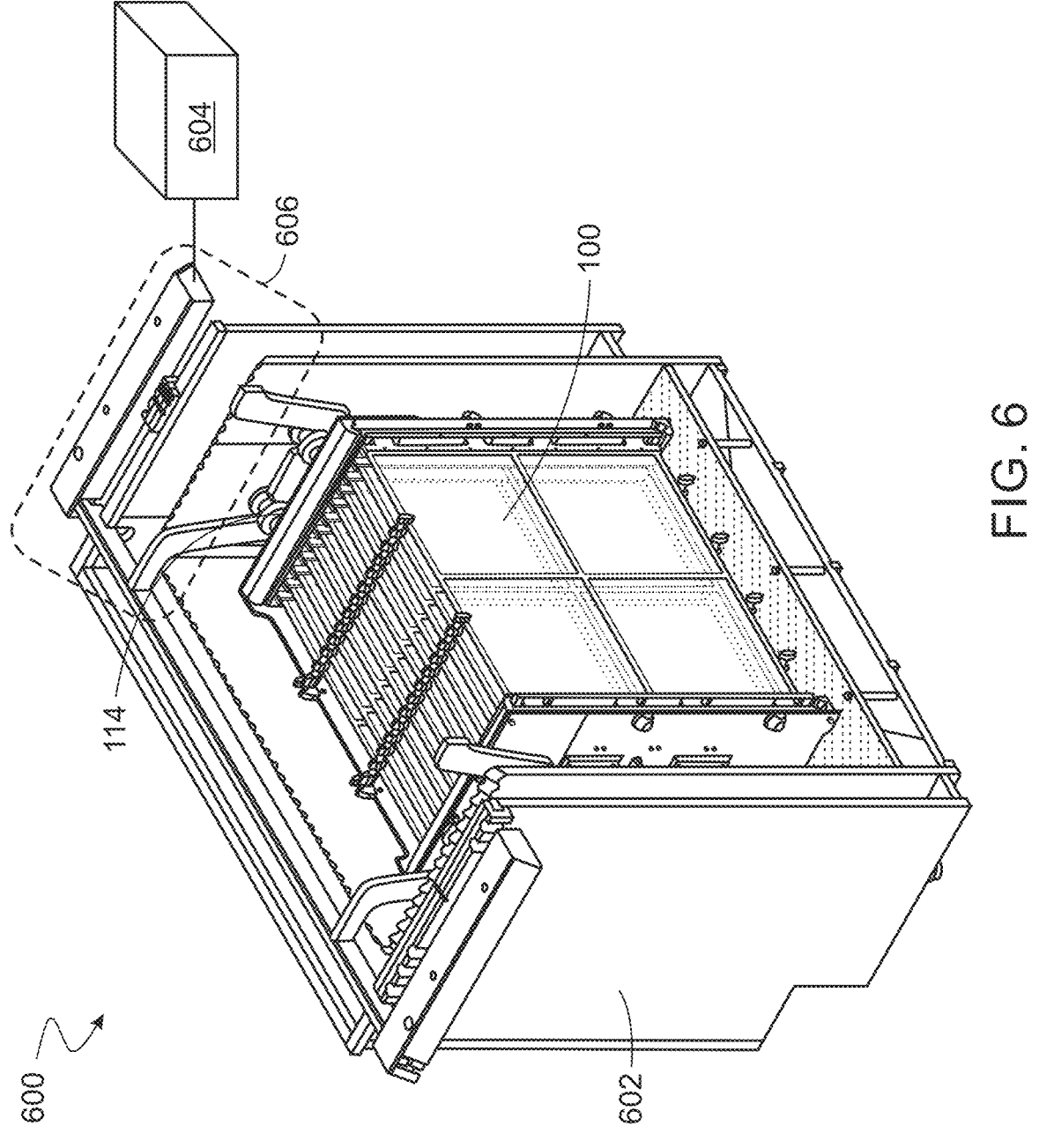
FIG. 6 shows a perspective view a substrate processing system including a substrate carrier, according to one or more implementations.

The substrate carrier described above in various implementations can be integrated as a part of a processing equipment. In some implementations, the processing equipment is configured to process multiple substrates at once, and accordingly includes multiple substrate carrier. FIG. 6 shows a schematic of a substrate processing system 600 including a substrate carriers 100. The design of the substrate carriers 100 can be the same as those described previously referring to FIGS. 1-4, and thus will not be repeated.

In various implementations, the substrate processing system 600 is configured to perform a wet process that involves treating the substrates with a treatment fluid, e.g., a chemical treatment fluid or a cleaning fluid. As illustrated in FIG. 6, the substrate processing system 600 can include a vessel 602 to hold the treatment fluid and house at least one substrate carrier 100. Further, the substrate processing system 600 can include a controller 604 and an agitation mechanism 606. As illustrated in FIG. 6, the substrate processing system 600 can be configured to receive the substrate carrier 100 via the handles 114 of the substrate carrier 100.

In the processing and cleaning of substrates, agitation can ensure effective hydrogen bubble removal, leading to better process uniformity and defect reduction. In various implementations, the agitation mechanism 606 includes electric motors, which rotate a shaft at specific speeds to achieve the desired level of agitation. In some implementations, the agitation mechanism 606 provides acceleration up to 2 G. The substrate carrier 100 can offer the clamping force large enough to hold the substrate in a fixed position relative to the substrate carrier at acceleration of 2 G. With such an acceleration, in some implementations, the substrate experiences 12 G equivalent vibrations.

In various implementations, the controller 604 is understood to be one or more computing systems connected to one or more components of the substrate processing system 600 to receive signals indicative of physical parameters of substrate processing system 600, e.g., flow rates, agitation rate, temperature(s), and/or the like, and to send signals that control elements of the substrate processing system 600. For example, the controller 604 can send signals to the agitation mechanism 606 to perform agitation at a certain acceleration rate or frequency. The controller 604 can include one or more computing systems local to and/or remote from other components of the substrate processing system 600.

In some implementations, the substrate carrier 100 further includes an inbuilt radio-frequency identification (RFID) tag. For example, an RFID tag can be placed on an external surface of the substrate carrier 100 for scanning. The RFID tag can provide enhanced traceability of the batch of substrates housed in the substrate carrier 100 by enabling real-time monitoring of the location of the substrate carrier in the production line.

In some implementations, the controller 604 includes a computing system. The term "computing system" as used in this disclosure may encompass all apparatus, devices, and machines for processing data, including by way of example a programmable processor, a computer, or multiple processors or computers. A computing system, such as the controller 604, can include, in addition to hardware, code that creates an execution environment for the computer program in question, e.g., code that constitutes processor firmware, a protocol stack, a database management system, an operating system, or a combination of one or more of them.

As described above, the substrate carrier of this disclosure can have an improved capacity to twelve substrates simultaneously, allowing higher batch processing and reducing overall cycle time for various process stages. Further, the adjustable clamping mechanism of the substrate carrier enables faster substrate handling, loading, and unloading, improving operational efficiency. With the capability to tune the clamping force, the substrate carrier can prevent substrate slippage, flexing, and breakage, reducing material loss and increasing yield. In addition, shock agitation compatibility of the substrate carrier can help effective hydrogen bubble removal, leading to better process uniformity and defect reduction. With these advantages, the substrate carrier can help reducing scrap rates and rework costs. The smooth surface design of the substrate carrier can also lead to less chemical carryover and shorter drying times, optimizing chemical consumption and reducing operational costs.

While this disclosure contains many specific implementation details, these should not be construed as limitations on the scope of any invention or of what may be claimed, but rather as descriptions of features that may be specific to particular implementations of particular inventions. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results.

What is claimed is:

1. A substrate carrier comprising:
an enclosure to hold a plurality of substrates, the enclosure comprising,
walls configured to surround the plurality of substrates, wherein the walls comprise a front panel, a back panel parallel to the front panel, and two side panels perpendicular to the front and back panels and to the plurality of substrates,
a top opening, and
a bottom opening;
an adjustable clamping mechanism on each of the two side panels, the adjustable clamping mechanism comprising a plurality of pairs of jaws that are each configured to clamp a substrate of the plurality of substrates, wherein the jaws in each pair face one another with an intervening gap that is configured to accommodate a substrate; and
a locking mechanism on at least one of the two side panels, the locking mechanism configured to lock positions of the plurality of pairs of jaws to fix positions of the plurality of substrates.

2. The substrate carrier of claim 1, wherein each pair of jaws comprises a fixed jaw and a movable jaw, and wherein the intervening gap is adjustable by moving the movable jaw.

3. The substrate carrier of claim 1, wherein each pair of jaws comprises a fixed jaw and a movable jaw, and wherein the adjustable clamping mechanism further comprises:
a movable support attached to the plurality of pairs of jaws and configured to be maneuvered to control positions of the plurality of movable jaws.

4. The substrate carrier of claim 3, further comprising a moving mechanism to maneuver the movable support.

5. The substrate carrier of claim 4, further comprising a controller coupled to the moving mechanism, the controller configured to control the moving mechanism to maneuver the movable support.

6. The substrate carrier of claim 3, wherein the locking mechanism is configured to lock the positions of the plurality of movable jaws by locking a position of the movable support.

7. The substrate carrier of claim 1, wherein each pair of jaws of the adjustable clamping mechanism comprises a plurality of elastomeric buttons that are disposed on each jaw of the pair of jaws, the plurality of elastomeric buttons configured to be in contact with a substrate to clamp the substrate between the pair of jaws.

8. The substrate carrier of claim 1, wherein the plurality of elastomeric buttons comprise a perfluoroelastomer (FFKM).

9. The substrate carrier of claim 1, wherein the adjustable clamping mechanism further comprises a sensor to monitor a clamping force applied by the plurality of the movable jaws to the plurality of substrates.

10. The substrate carrier of claim 1, further comprising a plurality of handles attached to the enclosure, the plurality of handles configured to be coupled to an agitation mechanism to agitate the substrate carrier.

11. The substrate carrier of claim 1, further comprising a plurality of bottom mandrels bridging the front and back panels at bottom portions of the front and back panels.

12. The substrate carrier of claim 11, further comprising a plurality of top removable mandrels bridging the front and back panels at top portions of the front and back panels, wherein at least one of the bottom mandrels or the top removable mandrels are configured to maintain uniform spacing among the substrates clamped in the enclosure.

13. The substrate carrier of claim 1, wherein the enclosure is made of stainless steel.

14. The substrate carrier of claim 1, wherein the plurality of fixed jaws and the plurality of movable jaws are made of polyetheretherketone (PEEK) or polytetrafluoroethylene (PTFE).

15. A substrate carrier comprising:
a stainless-steel enclosure to hold more than one substrate aligned vertically, the stainless-steel enclosure comprising,
walls configured to surround the substrates, wherein the walls comprise a front panel, a back panel parallel to the front panel, and two side panels perpendicular to the front and back panels and to the substrates,
a top opening, and
a bottom opening;
an adjustable clamping mechanism on each of the two side panels, the adjustable clamping mechanism comprising,
a plurality of pairs of jaws that are each configured to clamp one of the substrates, wherein the jaws in each pair face one another with an intervening gap that is configured to accommodate the one of the substrates, and wherein each pair of jaws comprises a fixed jaw and a movable jaw, and wherein the intervening gap is adjustable by moving the movable jaw, a movable support attached to the movable jaws, a moving mechanism attached to the movable support, and a controller coupled to the moving mechanism, the controller configured to control positions of the movable jaws by moving the movable support;

a locking mechanism on each of the two side panels, configured to lock positions of the movable jaws to fix positions of the substrates within the stainless-steel enclosure.

16. The substrate carrier of claim 15, wherein the controller is further configured to:

based on a thickness of the one of the substrates, determine a target clamping force to apply to the one of the substrates;

using a sensor attached to the adjustable clamping mechanism, monitor a clamping force applied to the one of the substrates; and based on the monitored clamping force, make an adjustment to achieve the target clamping force.

17. The substrate carrier of claim 15, further comprising:

a plurality of bottom mandrels bridging the front and back panels at bottom portions of the front and back panels; and a plurality of top removable mandrels bridging the front and back panels at top portions of the front and back panels.

18. A system for wet processing a plurality of substrate, the system comprising:

a vessel filled with a treatment fluid, configured to receive a substrate carrier holding a plurality of substrates;

a temperature controller to maintain a temperature of the treatment fluid in the vessel;

an agitation mechanism to provide an agitation to the substrate carrier during a wet processing of the plurality of substrates; and the substrate carrier, comprising, an enclosure to hold the plurality of substrates, the enclosure comprising, walls configured to surround the plurality of substrates, a top opening, and a bottom opening, wherein the walls comprise a front panel, a back panel parallel to the front panel, and two side panels perpendicular to the front and back panels and to the plurality of substrates; and an adjustable clamping mechanism on each of the two side panels, the adjustable clamping mechanism comprising a plurality of pairs of jaws that are each configured to clamp a substrate of the plurality of substrates, wherein the jaws in each pair face one another with an intervening gap that is configured to accommodate a substrate.

19. The system of claim 18, wherein each pair of jaws comprises a fixed jaw and a movable jaw, and wherein the intervening gap is adjustable by moving the movable jaw.

20. The system of claim 19, wherein the substrate carrier further comprises a locking mechanism on each of the two side panels, configured to lock positions of the movable jaws to fix positions of the plurality of substrates.

* * * * *